United States Patent
Sevcik et al.

(10) Patent No.: US 9,859,865 B2
(45) Date of Patent: Jan. 2, 2018

(54) IMPEDANCE MATCHING ELEMENT FOR VOLTAGE AND/OR CURRENT SENSING DEVICES

(71) Applicant: ABB TECHNOLOGY AG, Zurich (CH)

(72) Inventors: Bretislav Sevcik, Nemcice nad Hanou (CZ); Petr Velesik, Brno (CZ); Radek Javora, Brno (CZ)

(73) Assignee: ABB Schweiz AG, Baden (CH)

(*) Notice: Subject to any disclaimer, the term of this patent is extended or adjusted under 35 U.S.C. 154(b) by 67 days.

(21) Appl. No.: 14/713,625

(22) Filed: May 15, 2015

(65) Prior Publication Data

US 2015/0333725 A1   Nov. 19, 2015

(30) Foreign Application Priority Data

May 15, 2014 (EP) .................................... 14001713

(51) Int. Cl.
*H03H 7/38* (2006.01)
*G01R 19/00* (2006.01)
*H02J 5/00* (2016.01)

(52) U.S. Cl.
CPC .............. *H03H 7/38* (2013.01); *G01R 19/00* (2013.01); *G01R 19/0023* (2013.01); *H02J 5/005* (2013.01)

(58) Field of Classification Search
CPC ....... H03H 7/38; G01R 19/00; G01R 19/0023
See application file for complete search history.

(56) References Cited

U.S. PATENT DOCUMENTS

| 2009/0309605 A1 | 12/2009 | Prance et al. | |
| 2010/0156441 A1* | 6/2010 | Moliton | G01R 15/06 324/681 |
| 2015/0207333 A1* | 7/2015 | Baarman | H02J 17/00 307/104 |
| 2015/0214746 A1* | 7/2015 | Lopez Gomez | H01B 13/02 307/11 |

FOREIGN PATENT DOCUMENTS

| EP | 2 722 678 A1 | 4/2014 |
| FR | 2 698 696 A1 | 6/1994 |

OTHER PUBLICATIONS

European Search Report dated on Oct. 20, 2014 for Application No. 14001713.8.

* cited by examiner

*Primary Examiner* — David M Gray
*Assistant Examiner* — Michael Harrison
(74) *Attorney, Agent, or Firm* — Taft Stettinius & Hollister LLP

(57) ABSTRACT

An impedance matching element is disclosed which can be used for voltage and/or current sensing or indicating devices used in medium voltage systems in order to improve signal integrity of output signals in comparison with known sensing devices. To enhance sensing accuracy and provide higher output signal immunity against interferences and impedance mismatches, the electric field sensor and/or the magnetic field sensor can be connected to the impedance matching element which allows connection to an independent analog measuring device and is powered from an energy harvester, with an impedance matching electronic board.

20 Claims, 7 Drawing Sheets

# IMPEDANCE MATCHING ELEMENT FOR VOLTAGE AND/OR CURRENT SENSING DEVICES

RELATED APPLICATIONS

This application claims priority under 35 U.S.C. §119 to European Patent Application No. 14001713.8 filed in Europe on May 15, 2014, the entire content of which is hereby incorporated by reference in its entirety.

FIELD

The present disclosure is related to an impedance matching element which can be used for voltage and/or current sensing or indicating devices used in medium voltage systems in order to improve signal integrity of output signals in comparison with known sensing devices.

BACKGROUND INFORMATION

Operation of sensing devices is based on several principles where measuring accuracy by each of them is more or less dependent on characteristics of signal transmission path and parameters of input circuits of the measuring devices such as relays, measuring units etc. Thus, load impedance mismatch and variation of additional stray or parasitic capacitances might influence the measurement accuracy of MV instrument transformers. It can also result in high sensitivity towards external electric and/or magnetic fields. In such cases, it is necessary to adapt signal outputs of each sensing device for each type of measuring device separately or include a special filter circuits at the input side of the measuring devices in order to ensure a sufficient signal integrity.

Present devices for addressing the already described issues include design of output impedances of sensing devices close to the input impedances of measuring devices or providing correction setting directly in a measuring device. Such solutions can become impractical with increasing numbers of measuring devices with different input circuit parameters. It is therefore known to use any of the following solutions:

1) Proper output impedance design—this solution is used in cases where more than just one type of measurement device is used. It is highly impractical because various output impedance designs are used for each of the measuring devices and special instructions are used to avoid sensing device damage due to the design confusion.

2) Correction setting of measuring device—this solution is used separately or together with the impedance design described above. The measured values can be adjusted (corrected) in a certain range due to the offset function in the measuring device. If various output impedances of sensing devices are considered, the correction settings must be performed for each of them. Where different lengths of connecting cables are used, an additional time for the configuration of the measuring device for certain variants is required.

3) Correction using additional passive components—in certain cases, additional corrections to improve sensing device accuracy are performed by using external passive components such as capacitors or resistors. However, the solution is still tailored to the specific applications.

The above-described methods to improve signal integrity of sensing devices and measuring accuracy show that where there is more variability of these devices, additional complexities in their configuration before or after measuring are required. Moreover, in the case of using only one signal from a sensing device to multiple devices at the same time, there are no known satisfactory solutions. All the above issues can be solved by using impedance matching elements as described herein.

SUMMARY

A current and/or voltage sensing device for integration with electric systems, the sensing device comprising: at least one magnetic field sensor and/or at least one electric field sensor, the electric field sensor and/or the magnetic field sensor being connected with an impedance matching element configured for connection to an independent analogue measuring device; and an energy harvester for providing a stable power supply to the impedance matching element as part of the impedance matching element (e.g., integral with an impedance matching electronic board).

BRIEF DESCRIPTION OF THE DRAWINGS

Exemplary embodiments are disclosed herein by reference to the figures wherein like elements are represented by like numerals, and wherein.

DETAILED DESCRIPTION

Figure 1:
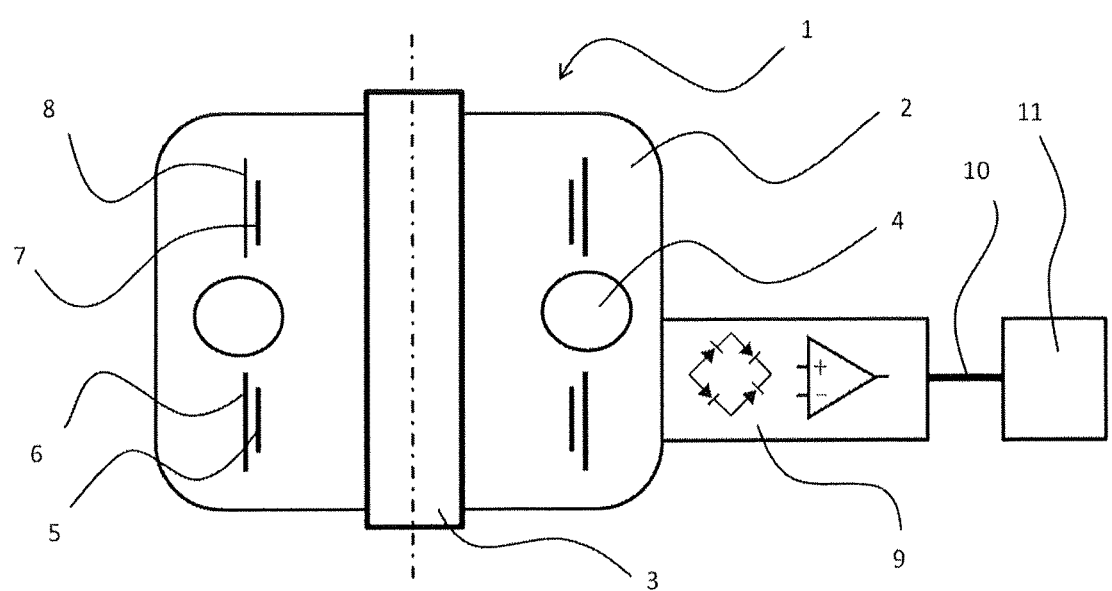
FIG. 1 shows an exemplary combined current/voltage sensing device with a harvesting system.

Exemplary embodiments as disclosed herein can enhance the sensing accuracy and provide a higher output signal immunity against interferences and impedance mismatches, via a compact and constructionally effective way.

According to exemplary embodiments, an electric field sensor and/or the magnetic field sensor is connected to an impedance matching element which allows connection to an independent analogue measuring device and is powered from an energy harvester, providing a stable power supply to the impedance matching element, as an integral part of the impedance matching element (e.g., an impedance matching electronic board).

In an exemplary embodiment, the energy harvester is powered from a magnetic field and/or electric field sensor, or alternatively powered from an external power source.

In another exemplary embodiment, the impedance matching element provides an output proportional to the measured quantities, such as electric and/or magnetic field, and is independent of the input impedance of the connected device.

In another exemplary embodiment, the impedance matching element is capable of further conditioning output signals. In exemplary embodiments, the impedance matching element is capable of providing a digital output.

In a further exemplary advantageous embodiment, the impedance matching element is connected with an output cable of the device.

Furthermore, the impedance matching element can be connected not only with new devices produced, but also with existing sensing devices already installed in the applications, and thus be suitable for retrofit purposes.

In a further exemplary embodiment, the impedance matching element can have internal monitoring and/or diagnostics of its functions.

In another exemplary embodiment, the energy harvester is powered from an electric field sensor designed as a capacitive voltage divider.

Exemplary embodiments can use modern low-power devices, together referred to as impedance matching elements that help to improve signal integrity and measuring accuracy of sensing devices, without the necessity of an external power source. Due to its high variability it can be used with existing sensing devices, where a current sensing device, in an exemplary embodiment, considers the use of Rogowski coil technology, that enables the use of one single device for the wide range of measured currents and that enables significantly reducing a size of the current sensing element. As such, the current sensing device does not contain any ferromagnetic core, it can be very light-weight, as well as compact, and therefore effective in construction.

An exemplary voltage sensing device can use either capacitive and/or resistive voltage divider technology. This technology also enables significant size and weight reduction, still achieving very good sensing accuracy. As both current and voltage sensing technologies enable creation of very small devices, it is easily possible to combine them into one single device together with an independent power source for an impedance matching element. This possibility is utilized in a proposed construction of a small sized combined current/voltage sensing device with integrated additional electrodes for a harvesting system which is part of an impedance matching element.

According to an exemplary embodiment, the current sensor, voltage sensor and electrodes for the harvesting system are implemented together in one common device (e.g., integrated circuit board), for example of a toroidal sensor housing, such that the current sensor coil is arranged in the middle between the voltage electrodes and electrodes for harvesting, as described below. However, using an impedance matching element is not limited to existing sensing devices already installed in the applications but can be easily connected with newly produced devices, with at least one magnetic field sensor and/or at least one electric field sensor.

An exemplary combined sensing device 1 includes (e.g., consists of) insulating material 2, that provides sufficient dielectric strength, depending on the voltage level applied on primary conductor 3. Current sensing part 4 senses a magnetic field that is proportional to the current flowing through the primary conductor 3. A voltage sensing part includes (e.g., consists of) a primary capacitance created between primary conductor 3 and capacitive electrode 5 and a secondary capacitance created between capacitive electrode 5 and shielding electrode 6. Shielding electrode 6 will protect capacitive electrode 5 from external electric fields, thus providing shielding from external disturbances. In case a division ratio of capacitances created between primary conductor 3, capacitive electrode 5 and shielding electrode 6 is not sufficient to create a required ratio, external capacitors could be electrically connected in parallel to the output of such voltage divider to tune the divider ratio to a required level. The harvesting portion can include (e.g., consist of) a primary capacitance created between primary conductor 3 and capacitive electrode 7 and a secondary capacitance created with respect to capacitive electrode 8. The required ratio is achieved by using an external capacitor similarly as described above. The harvesting system 9 can be a part of the cable connection 10 that connects the sensing device with a measuring device.

Figure 2A:
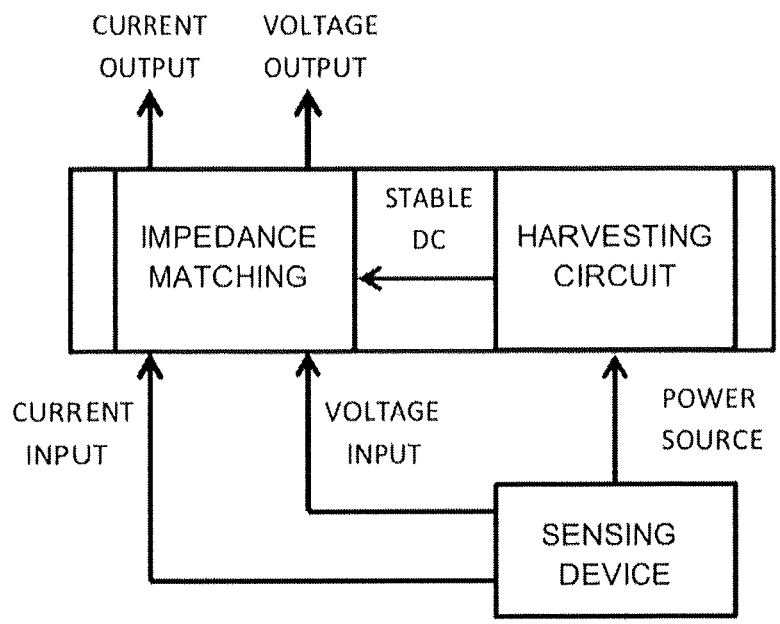
FIGS. 2A and 2B show a location of an exemplary harvesting system if non-conventional power sources are used.
Figure 2B:
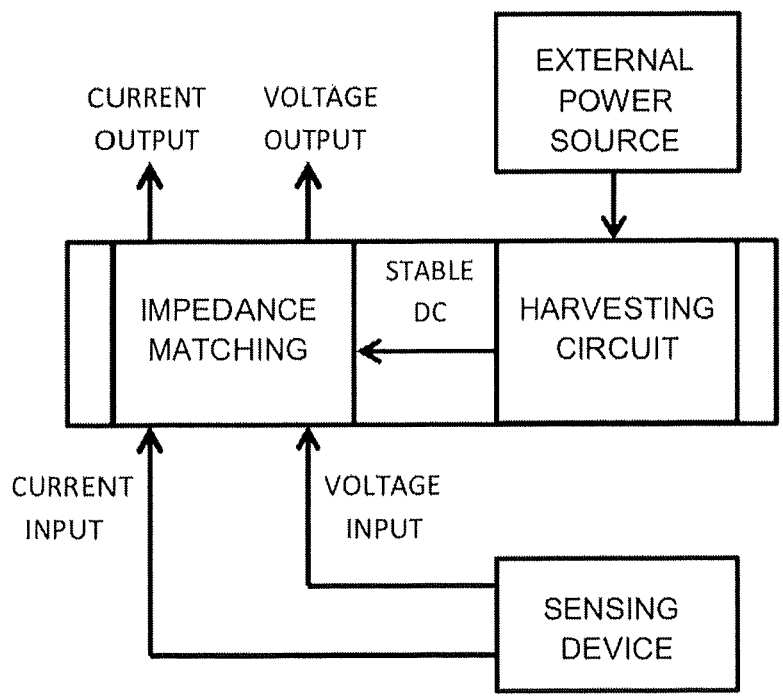

Due to the variability of a harvesting system, a simple configuration of an output voltage for a supply of active electronics is possible, for example for four voltage DC levels 1.8V, 2.5V, 3.3V and 3.6V. Thus, all voltage levels for modern low-power integrated circuits are available. The system can include (e.g., consist of) an automatic voltage clamping regulation so the output voltage stability is ensured. A proposed exemplary system can also excel in a wide variety of usable input power sources depending on the type of ambient energy available. In this case, piezoelectric elements, electric field, thermoelectric energy, solar energy, DC or AC known voltage sources can be used. Possible exemplary system configurations are shown in FIG. 2A for a version with an internal supply, and in FIG. 2B for a version with an external power source. The impedance matching element is for example capable of further conditioning of output signals. Thus, additional signal adjustment such as integration can be performed. Based on the device configurations in the impedance matching element, an analog or a digital output can be provided.

Figure 3:
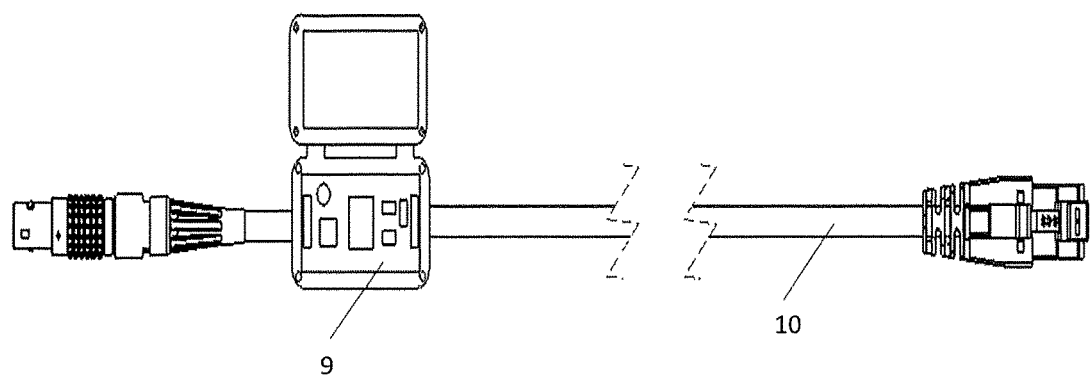
FIG. 3 shows a location of an exemplary harvesting system if non-conventional power sources are used.

Based on the selected input power source, the harvesting system 9 can be placed in cable connection 10 according to FIG. 3, if for example a non-conventional power source is used (internal supply, see FIG. 2A).

Figure 4:
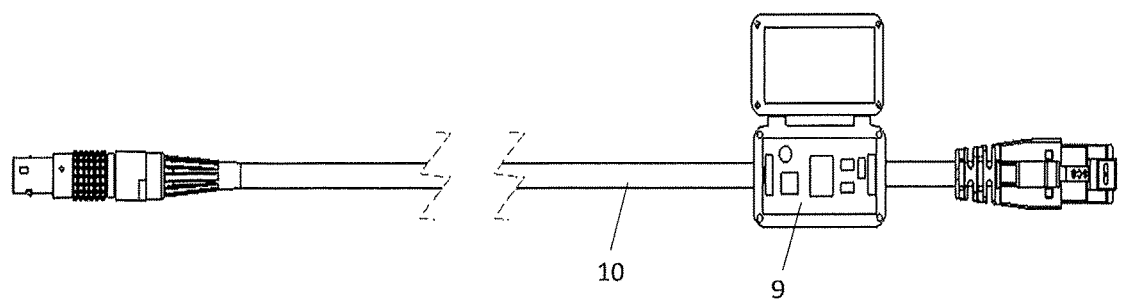
FIG. 4 shows a location of an exemplary harvesting system if conventional power sources are used.

Due to the usability of both AC or DC voltage sources the harvesting system can be powered directly from a measured device. In this case the harvesting system 9 is placed in cable connection 10 according to FIG. 4 (external power source, see FIG. 2B).

Figure 5A:
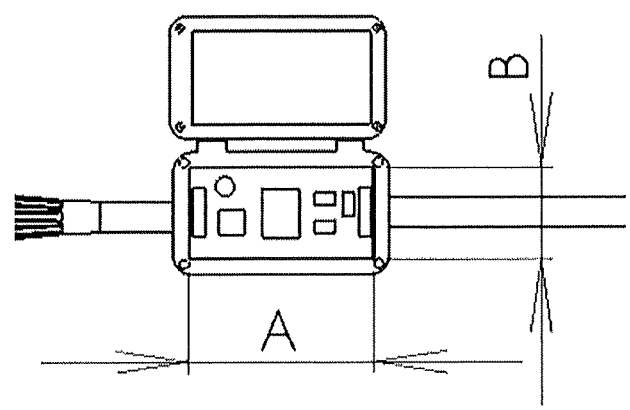
FIGS. 5A and 5B show exemplary harvesting system dimensions.
Figure 5B:
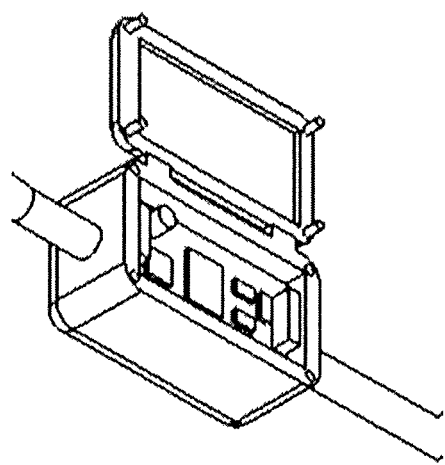

Dimensions of the entire system due to the using of modern integrated circuits can be reduced to, for example less than 40 mm in length A and less than 20 mm in height B, see FIGS. 5A and 5B.

Figure 6:
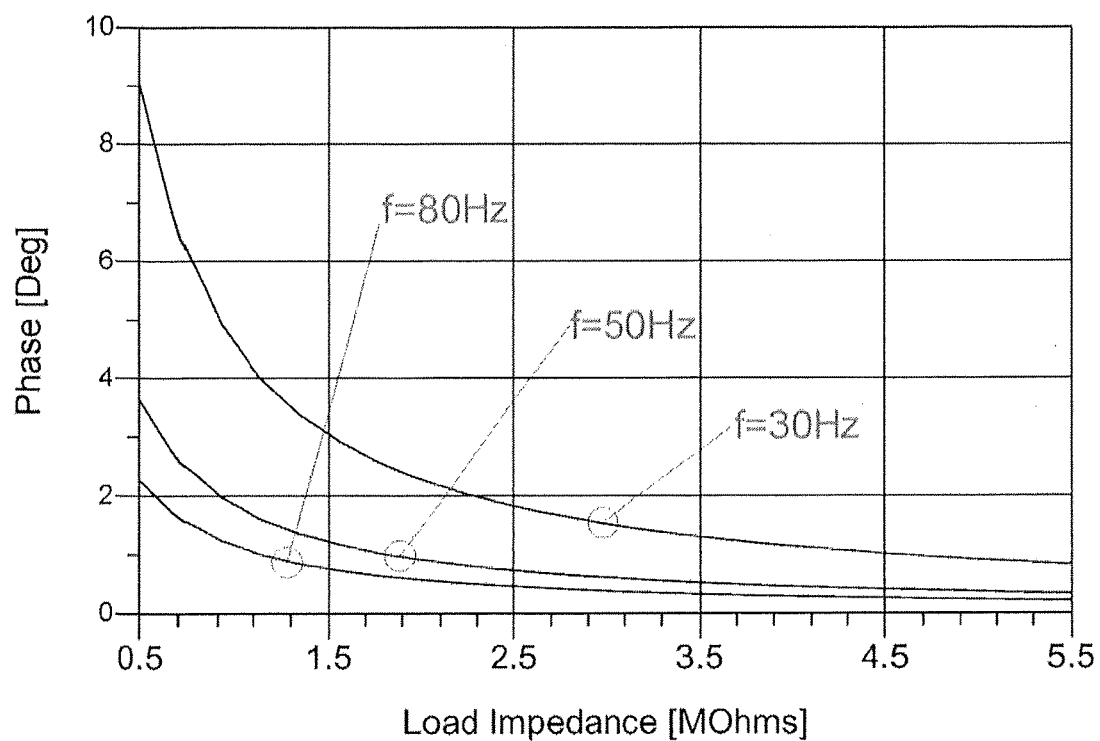
FIG. 6 shows phase variation of known sensing devices vs. load impendences.

An exemplary advantage of the proposed exemplary solution is in product application where measuring devices with variable input impedances are used. As it can be seen from FIG. 6, a known sensing device has strong dependence on input impedance variation of measuring devices. Both amplitude and phase of a signal are affected. However, the signal phase as affected can be critical in the exemplary analyzed frequency range from 10 Hz to 100 Hz. The proposed sensing device can be used together with all types of measuring devices without any additional reconfiguration during impedance mismatch. Thus, the stability of signal phase and amplitude are independent of input impedance of measuring devices, and undesirable phenomena as shown in FIG. 6 are minimized.

The harvesting system can for example be optimized for wide bandwidth low power applications, can have an extremely high gain-bandwidth to power ratio and can be unity gain stable. Thus, the system frequency response need not affect the output signal from the sensing device. Due to the cable connection, additional parasitic load capacitances at the output of sensing device may occur. Its size can depend on many factors, such as type of cable, cable length etc. It can cause further signal degradation. The exemplary proposed impedance matching element is designed to directly drive up to 100 nF capacitive load in unity gain.

Higher gain configurations tend to have better capacitive drive capability than lower gain configurations.

Figure 7:
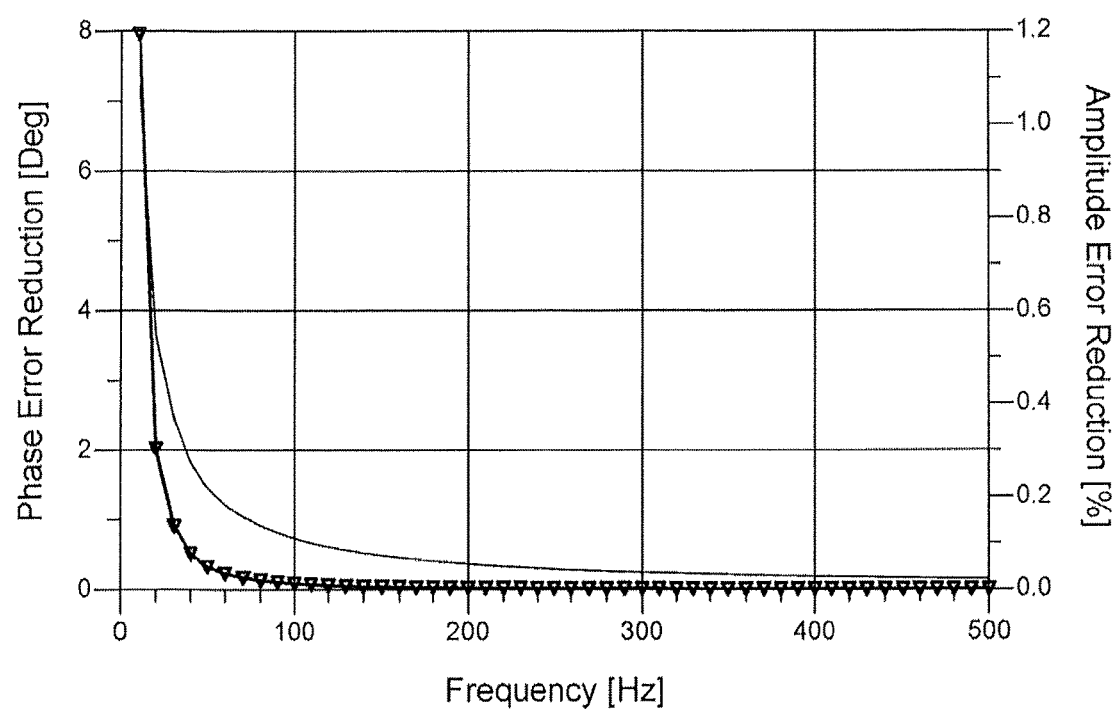
FIG. 7 shows exemplary amplitude and phase error reduction by using a proposed exemplary sensing device as disclosed herein.

The final results in FIG. 7 show the exemplary signal integrity improvement if an exemplary proposed sensing device is used. Especially at the low frequencies (below 100 Hz), the error reduction is significant.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

NUMBERING IN THE FIGURES 1 sensing device
2 insulating material
3 primary conductor
4 current sensing part
5 capacitive electrode
6 shielding electrode
7 capacitive electrode
8 capacitive electrode
9 harvesting system
10 cable connection

The invention claimed is:

1. A current and/or voltage sensing device for integration with electric systems, the sensing device comprising:
    at least one magnetic field sensor and/or at least one electric field sensor, the electric field sensor and/or the magnetic field sensor being connected with an impedance matching element configured for connection to an independent analogue measuring device; and
    an energy harvester for providing a stable power supply to the impedance matching element as part of the impedance matching element;
    wherein the energy harvester is part of a cable connection connecting the sensing device with the measuring device; and
    wherein the energy harvester comprises a primary capacitance between a primary conductor and a first capacitive electrode and a secondary capacitance between the first capacitive electrode and a second capacitive electrode.

2. The current and/or voltage sensing device according to claim 1, wherein the energy harvester is powered from a magnetic field and/or electric field sensor.

3. The current and/or voltage sensing device according to claim 1, wherein the energy harvester is powered from external power source.

4. The current and/or voltage sensing device according to claim 1, wherein the impedance matching element provides an output proportional to the measured quantities, and is independent of an input impedance of a device to be connected thereto.

5. The current and/or voltage sensing device according to claim 1, wherein the impedance matching element is configured for conditioning output signals.

6. The current and/or voltage sensing device according to claim 1, wherein the impedance matching element provides a digital output.

7. The current and/or voltage sensing device according to claim 1, wherein the impedance matching element is connected with an output cable of said device.

8. The current and/or voltage sensing device according to claim 1, wherein the impedance matching element can be connected not only with new devices produced, but also with existing sensing devices already installed in the applications, and is configured for retrofit purposes.

9. The current and/or voltage sensing device claim 1, wherein the impedance matching element provides internal monitoring and/or diagnostics of its functions.

10. The current and/or voltage sensing device according to claim 2, wherein the energy harvester is powered from an electric field sensor configured with a capacitive voltage divider.

11. The current and/or voltage sensing device according to claim 4, wherein the impedance matching element provides an output proportional to the electric and/or magnetic field and is independent of an input impedance of a device to be connected thereto.

12. The current and/or voltage sensing device according to claim 2, wherein the impedance matching element provides an output proportional to the measured quantities, and is independent of an input impedance of a device to be connected thereto.

13. The current and/or voltage sensing device according to claim 3, wherein the impedance matching element provides an output proportional to the measured quantities, and is independent of an input impedance of a device to be connected thereto.

14. The current and/or voltage sensing device according to claim 12, wherein the impedance matching element is configured for conditioning output signals.

15. The current and/or voltage sensing device according to claim 13, wherein the impedance matching element is configured for conditioning output signals.

16. The current and/or voltage sensing device according to claim 14, wherein the impedance matching element provides a digital output.

17. The current and/or voltage sensing device according to claim 16, wherein the impedance matching element is connected with an output cable of said device.

18. The current and/or voltage sensing device according to claim 17, wherein the impedance matching element can be connected not only with new devices produced, but also with existing sensing devices already installed in the applications, and is configured for retrofit purposes.

19. The current and/or voltage sensing device claim 18, wherein the impedance matching element provides internal monitoring and/or diagnostics of its functions.

20. The current and/or voltage sensing device according to claim 19, wherein the energy harvester is powered from an electric field sensor configured with a capacitive voltage divider.

* * * * *